(12) United States Patent
Chang et al.

(10) Patent No.: US 10,861,954 B2
(45) Date of Patent: Dec. 8, 2020

(54) HIGH-K FILM APPARATUS AND METHOD

(71) Applicant: Taiwan Semiconductor Manufacturing Company, Ltd., Hsinchu (TW)

(72) Inventors: Che-Cheng Chang, New Taipei (TW); Yi-Ren Chen, Guishan Township (TW); Chang-Yin Chen, Taipei (TW); Yi-Jen Chen, Hsinchu (TW); Ming Zhu, Singapore (SG); Yung-Jung Chang, Cyonglin Township (TW); Harry-Hak-Lay Chuang, Singapore (SG)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 16/241,560

(22) Filed: Jan. 7, 2019

(65) Prior Publication Data

US 2019/0157415 A1 May 23, 2019

Related U.S. Application Data

(62) Division of application No. 14/851,998, filed on Sep. 11, 2015, now Pat. No. 10,177,238, which is a (Continued)

(51) Int. Cl.
*H01L 29/51* (2006.01)
*H01L 29/40* (2006.01)
(Continued)

(52) U.S. Cl.
CPC ........ *H01L 29/517* (2013.01); *H01L 21/0234* (2013.01); *H01L 21/02181* (2013.01);
(Continued)

(58) Field of Classification Search
CPC . H01L 29/517; H01L 21/321; H01L 21/0234; H01L 29/78; H01L 29/66568;
(Continued)

(56) References Cited

U.S. PATENT DOCUMENTS 5,326,427 A 7/1994 Jerbic
5,605,724 A * 2/1997 Hong ................ H01L 21/76856
427/535

(Continued)

OTHER PUBLICATIONS

Park, H.B. et al., "Performance and Reliability Improvement of HfSION Gate Dielectrics using Chlorine Plasma Treatment," Applied Physics Letters, vol. 94, 4 pages.

*Primary Examiner* — Marcos D. Pizarro
*Assistant Examiner* — Sue Tang
(74) *Attorney, Agent, or Firm* — Slater Matsil, LLP

(57) ABSTRACT

A device may include: a high-k layer disposed on a substrate and over a channel region in the substrate. The high-k layer may include a high-k dielectric material having one or more impurities therein, and the one or more impurities may include at least one of C, Cl, or N. The one or more impurities may have a molecular concentration of less than about 50%. The device may further include a cap layer over the high-k layer over the channel region, the high-k layer separating the cap layer and the substrate.

20 Claims, 4 Drawing Sheets

Related U.S. Application Data division of application No. 13/781,991, filed on Mar. 1, 2013, now Pat. No. 9,147,736.

(51) Int. Cl.
*H01L 21/28* (2006.01)
*H01L 29/49* (2006.01)
*H01L 29/66* (2006.01)
*H01L 21/02* (2006.01)
*H01L 21/321* (2006.01)
*H01L 21/285* (2006.01)
*H01L 21/3213* (2006.01)
*H01L 29/423* (2006.01)
*H01L 29/78* (2006.01)

(52) U.S. Cl.
CPC .... *H01L 21/2855* (2013.01); *H01L 21/28158* (2013.01); *H01L 21/28185* (2013.01); *H01L 21/28556* (2013.01); *H01L 21/321* (2013.01); *H01L 21/32136* (2013.01); *H01L 29/401* (2013.01); *H01L 29/42364* (2013.01); *H01L 29/4966* (2013.01); *H01L 29/513* (2013.01); *H01L 29/6656* (2013.01); *H01L 29/66568* (2013.01); *H01L 29/66575* (2013.01); *H01L 29/78* (2013.01)

(58) Field of Classification Search
CPC .......... H01L 29/6656; H01L 29/42364; H01L 21/32136; H01L 21/28556; H01L 21/2855; H01L 21/28158; H01L 21/02181; H01L 29/66575; H01L 29/513; H01L 29/4966; H01L 21/28185; H01L 29/401
See application file for complete search history.

(56) References Cited

U.S. PATENT DOCUMENTS

| | | |
|---|---|---|
| 5,899,719 A | 5/1999 | Hong |
| 6,124,158 A | 9/2000 | Dautartas et al. |
| 6,465,348 B1 | 10/2002 | Wang |
| 7,041,596 B1 | 5/2006 | Dalton et al. |
| 7,087,480 B1 | 8/2006 | Yao et al. |
| 2005/0104112 A1* | 5/2005 | Haukka ............. H01L 21/28088 257/310 |
| 2005/0124109 A1 | 6/2005 | Quevedo-Lopez et al. |
| 2005/0202659 A1 | 9/2005 | Li et al. |
| 2007/0066021 A1 | 3/2007 | Niimi et al. |
| 2010/0176456 A1 | 7/2010 | Ikeno et al. |
| 2011/0001195 A1 | 1/2011 | Park et al. |
| 2011/0073956 A1 | 3/2011 | Heinrich et al. |
| 2012/0071002 A1 | 3/2012 | Nakayama |
| 2012/0104506 A1 | 5/2012 | Wang et al. |
| 2012/0139061 A1 | 6/2012 | Ramachandran et al. |
| 2012/0261758 A1* | 10/2012 | Lee ................. H01L 21/823857 257/368 |
| 2013/0026578 A1 | 1/2013 | Tsau |
| 2013/0037889 A1 | 2/2013 | Liao et al. |
| 2013/0330900 A1 | 12/2013 | Pandey et al. |
| 2013/0344692 A1* | 12/2013 | Triyoso ............... H01L 21/3105 438/591 |
| 2014/0246736 A1 | 9/2014 | Chang et al. |
| 2016/0005832 A1 | 1/2016 | Chang et al. |

* cited by examiner

HIGH-K FILM APPARATUS AND METHOD

PRIORITY CLAIM AND CROSS-REFERENCE

This application is a divisional of U.S. patent application Ser. No. 14/851,998, entitled "High-K Film Apparatus and Method, filed on Sep. 11, 2015, which application is a divisional of U.S. patent application Ser. No. 13/781,991, now U.S. Pat. No. 9,147,736, entitled "High-K Film Apparatus and Method," filed on Mar. 1, 2013, which applications are hereby incorporated herein by reference.

BACKGROUND

Generally, one of the driving factors in the design of modern electronics is the amount of computing power and storage that can be shoehorned into a given space. The well-known Moore's law states that the number of transistors on a given device will roughly double every eighteen months. In order to compress more processing power into ever smaller packages, transistor sizes have been reduced to the point where the ability to further shrink transistor sizes has been limited by the physical properties of the materials and processes. The use of field effect transistors (FETs) is common in large scale integrated circuits. Metal gates separated from a semiconductor substrate by an oxide are commonly used in FETs, but high-K films and gate stacks are increasingly replacing oxide dielectrics and metal gate electrodes in FETs. High-K materials may permit greater capacitance across the gate while reducing the leakage current associated with ultra-thin oxide insulators, permitting circuits with lower power usage.

BRIEF DESCRIPTION OF THE DRAWINGS

For a more complete understanding of the present disclosure, and the techniques involved in making and using the same, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale. For clarity non-essential reference numbers are left out of individual figures where possible.

DETAILED DESCRIPTION OF ILLUSTRATIVE EMBODIMENTS

The making and using of the disclosed embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely making and using high-k film structures useful in, for example, field effect transistor (FET) devices. Other embodiments may also be applied, however, to other electrical components or structures, including, but not limited to, capacitors, FinFETs, dielectric insulators, dielectric layers, dielectric waveguides, or any component or structure employing a dielectric.

The presented disclosure is directed to providing a system and method for treating high-k films with a plasma process, such as a plasma treatment or plasma etch. The plasma treatment reduces residual impurities in the high-k film and reduces charge carriers within the film. The resulting treated high-k film structure provides an improved subthreshold current ($I_{off}$) performance, greater current carrying ($I_{ds}$ or $I_{on}$) capacity and reduced threshold voltage ($V_{ts}$).

Figure 1:
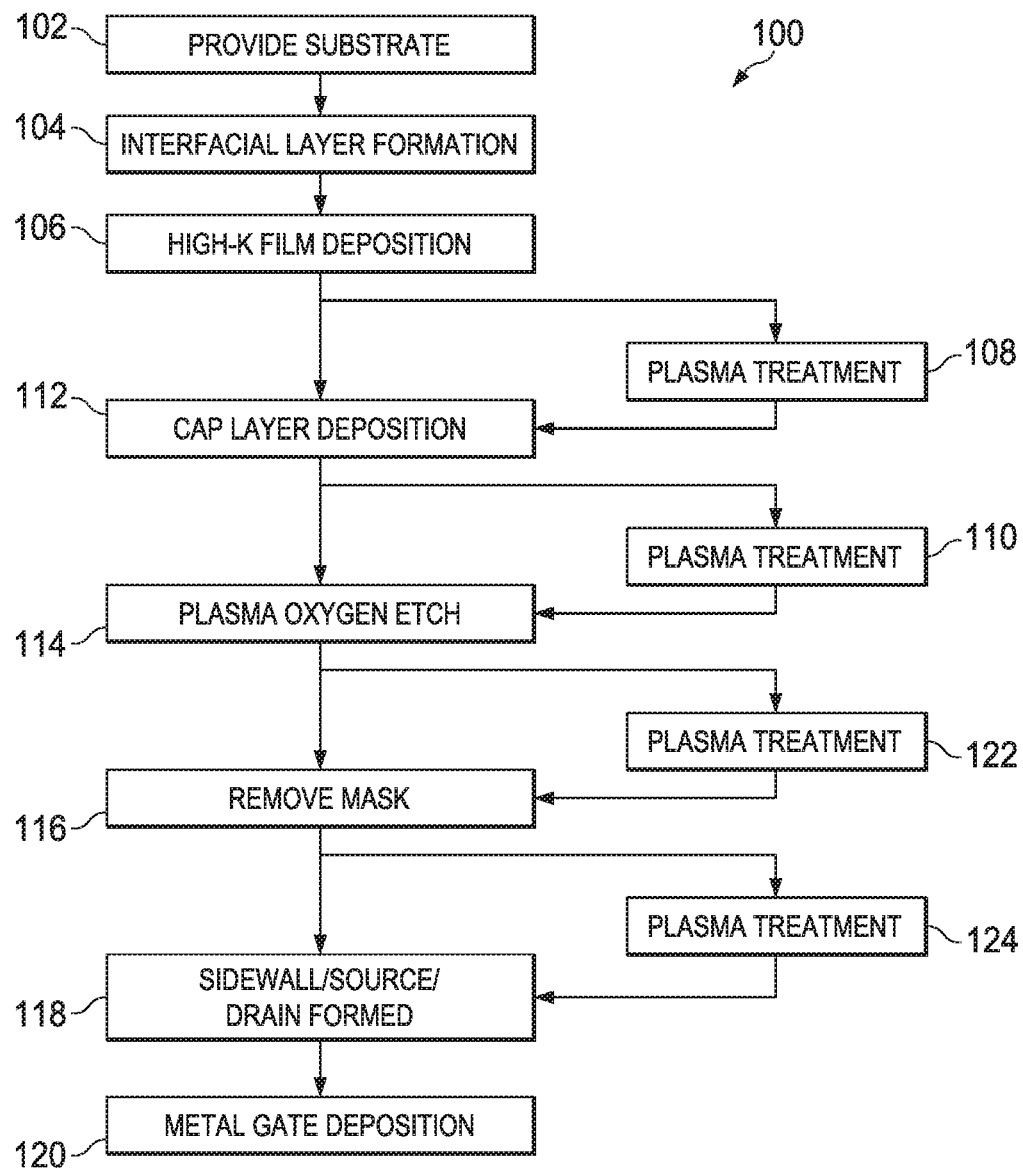
FIG. 1 is a flow diagram illustrating an embodiment of a method for forming and treating a high-k film structure.
Figure 2:
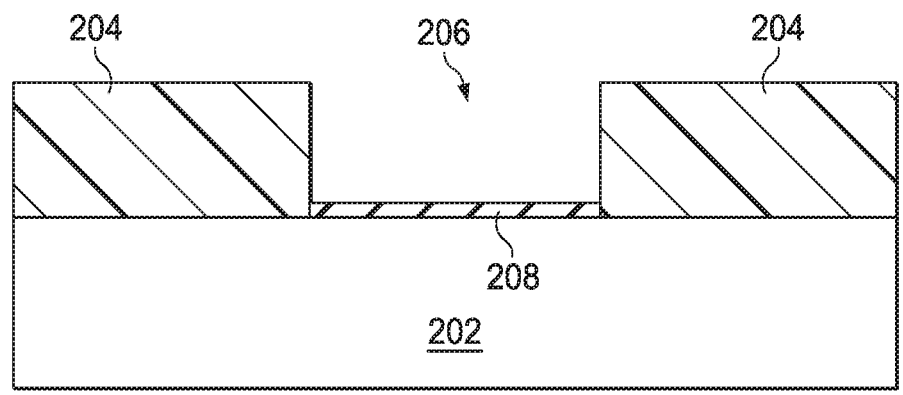
FIGS. 2-7 illustrate intermediate structures formed during an embodiment of a treatment of a high-k film.

Referring to FIG. 1, a flow diagram illustrates an embodiment of a method for treating a high-k film structure. Initially, a substrate 202 is provided in block 102, as shown in FIG. 2. The substrate 202 may have a mask 204 formed on a first side of the substrate 202 creating an opening defining a gate region 206. The gate region 206 may be above a predetermined or target channel region in the substrate 202. An interfacial layer (IL layer) 208 may optionally be formed or deposited on the substrate 202 in block 104. The IL layer 208, being formed in the gate region, may be disposed over the channel region in the substrate 202. In one embodiment, the IL layer 208 may be formed through epitaxial growth, atomic layer deposition, thermal oxidation, or another suitable process. For example, where the substrate 202 is germanium (Ge) or silicon (Si), a nitride or oxide may be formed. The IL layer 208 may be used to improve adhesion between the substrate 202 and subsequent layers. In an embodiment, the IL layer 208 may be applied with a thickness between about 5 angstroms and about 25 angstroms.

Figure 3:
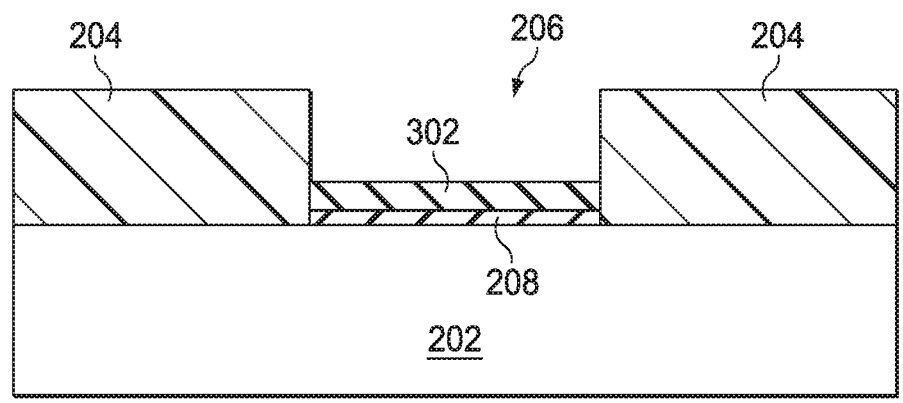

A high-k layer 302 may be deposited in block 106, as shown in FIG. 3. In an embodiment, the high-k layer 302 may be formed in the gate region 206 on the IL layer 208, where included. In another embodiment where the IL layer 208 is omitted, the high-k layer 302 may be formed directly on the substrate 202.

The high-k layer 302 may be formed of any material having suitable resistive and capacitive properties. A material having a dielectric constant (k) greater than that of silicon dioxide ($SiO_2$) may be used in some embodiments. Typically, silicon oxide ($SiO_2$) has a dielectric constant (k-value) of about 3.9. The high-k material may, for example, in an embodiment, have a dielectric constant greater than 3.9, or in other embodiments, may have a dielectric constant greater than about 15. An embodiment may utilize a high-k layer 302 of a hafnium-based material or hafnium compound. For example, the high-k layer may be hafnium compound such as hafnium oxide ($HfO_2$), which has a dielectric constant (k-value) of about 25. Hafnium oxide has a lower leakage current than silicon dioxide, particularly at very small thickness (below about 2 nm). Thus, in an embodiment, the high-k layer may be less than 2 nm thick.

In other embodiments, the high-k layer may be a hafnium silicate compound such as hafnium silicate oxide ($HfSiO_4$) (k-value between about 15 and about 18) or hafnium silicate oxynitride (HfSiON). In yet other embodiments, the high-k layer 302 may be a zirconium material such as zirconium oxide ($ZrO_2$) (k-value of about 25) or zirconium silicate oxide ($ZrSiO_4$), another metal oxide such as aluminum oxide ($Al_2O_3$), tantalum oxide ($Ta_2O_5$), lanthanum oxide ($LaO_x$) and praseodymium oxide ($Pr_2O_3$), or a polymer film.

Figure 4:
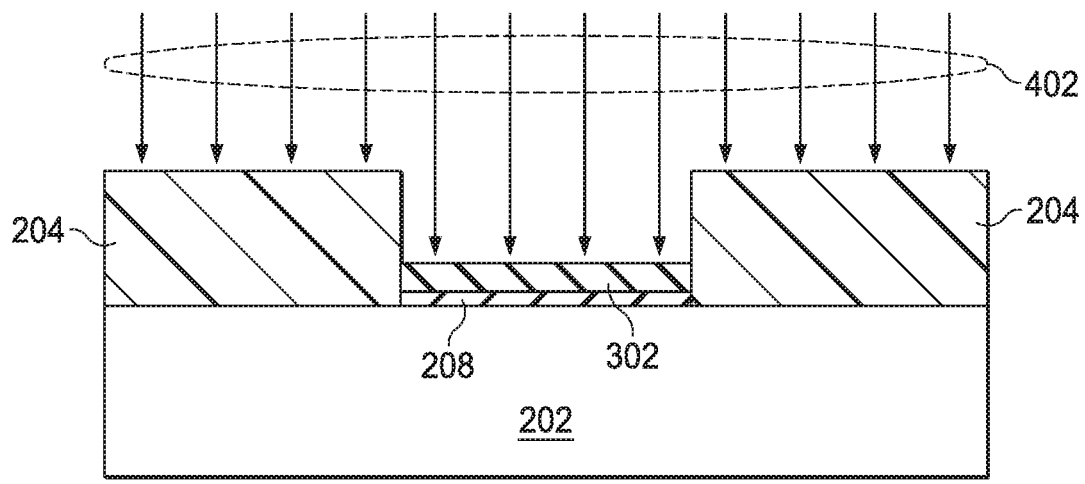

A plasma treatment may be performed in block 108, as shown in FIG. 4. The plasma treatment is illustrated by arrows 402 in FIG. 4. The plasma treatment may react with impurities in the high-k layer, in particular removing chlorine, carbon and nitrogen from the high-k layer 302. The plasma treatment reduces residual impurities in the high-k layer 302 and reduces charge carriers within the film. The resulting treated high-k film structure provides an improved subthreshold current ($I_{off}$) performance, greater current carrying ($I_{ds}$ or $I_{on}$) capacity and reduced threshold voltage ($V_{ts}$).

In some embodiments, the plasma treatment may be a chlorine or fluorine based plasma treatment. For example, a chlorine treatment may be applied using a $Cl_2$ base in a plasma treatment chamber. In another embodiment, a chlorine plasma treatment may use dilute $Cl_2$ gas, with the remaining treatment atmosphere being inert gas such as argon (Ar), helium (He), a combination of the preceding, or another inert material or noble gas. The $Cl_2$ gas may optionally be at a chlorine concentration of about 50%. In another embodiment, a fluorine plasma treatment may use a fluorine source such as $CF_4$, $CHF_3$, $NF_3$, or the like, and may be at a dilute fluorine gas, with the remainder of the treatment atmosphere being an inert material. In yet another embodiment, an oxygen plasma treatment may be used.

The impurities in the high-k layer may outgas as $C_xCl_x$, $C_xF_x$, $N_xF_x$ or the like, and may depend on the type of plasma treatment. In one embodiment, the mask 204 may remain over the substrate 202 during the plasma treatment to reduce plasma damage to the underlying substrate 202. In an embodiment where the plasma treatment is $Cl_2$, the plasma treatment may be performed at a pressure between about 2 milliTorr and about 30 milliTorr, with a source power between about 400 watts and about 1300 watts, and an optional bias between about 0 watts and about 300 watts. The plasma treatment may be applied for about 10 seconds, but the treatment time may be varied based on facts including, but not limited to, high-k layer 302 thickness, plasma treatment power, treatment material concentration, or the like. Additionally, the plasma treatment parameters such as pressure, bias, power and the like may be varied based on the type of plasma treatment, the target impurity concentration, the impurity concentration before plasma treatment, the stage of device fabrication at which the plasma treatment is performed or one or more other factors.

Figure 5:
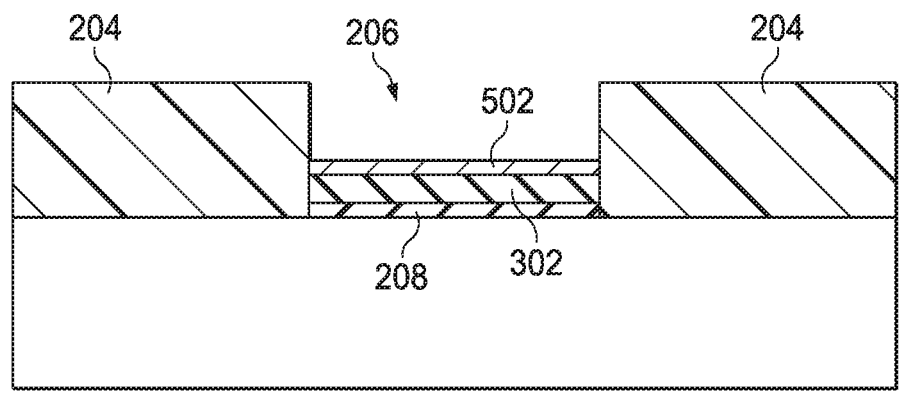

A cap layer 502 may be applied on the high-k layer 302 in block 112, as shown in FIG. 5. In one embodiment, the cap layer 502 may be titanium nitride (TiN), and the thickness of the TiN may be adjusted to result in a work function for subsequent layers falls into a desired range. Such a TiN cap layer 502 may be deposited using physical vapor deposition (PVD), ALD, or other suitable process. Alternatively, in some embodiments, an aluminum or lanthanum based compound, or another suitable material, may be applied as a cap layer 502.

The plasma treatment may optionally be performed in block 110 after the cap layer deposition in block 112, instead of after the high-k layer 302 deposition. In an embodiment where the plasma treatment is applied after the cap layer deposition of block 112, the plasma treatment may also remove at least a portion of one or more impurities from the cap layer 502 and the high-k layer 302.

A plasma oxygen etch of the cap layer may be performed in block 114. In one embodiment, a plasma oxygen etch may be used to adjust the thickness of the cap layer. For example, a TiN cap layer 502 may be oxygen plasma etched to a desired thickness. Additionally, the plasma treatment may optionally be performed, as shown in block 122 (FIG. 1), after the plasma oxygen etch.

The cap layer 502 or high-k layer 302 thicknesses may be adjusted to account for the reduced threshold voltage attributable to the plasma treatment. In one embodiment where the high-k layer 302 is plasma treated, a cap layer 502 may be deposited at a 0.3% greater thickness than a non-plasma treated high-k layer 302 system to account for the reduced $V_{th}$.

Figure 6:
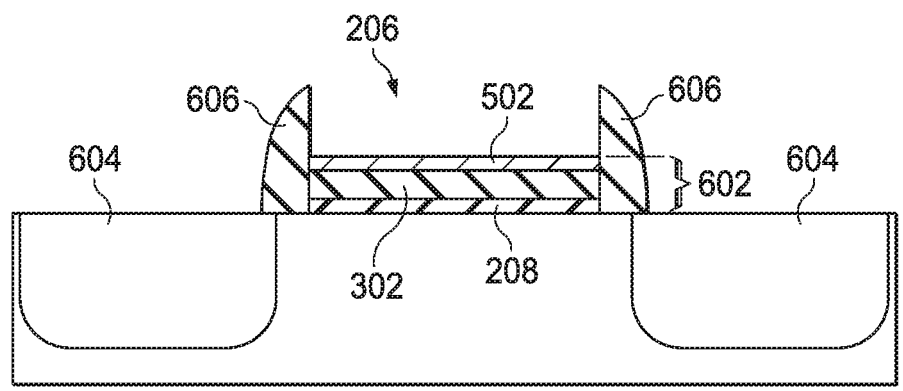

Referring to block 116 of FIG. 1, the mask 204 may optionally be removed to expose the gate stack 602. Referring to block 118 of FIG. 1, gate sidewall spacers 606 and source/drain regions 604 may be formed as shown in FIG. 6. The gate stack 602 may have gate sidewall spacers 606 formed on the gate stack 602 sidewalls. Such gate sidewall spacers 606 may be used in a self-patterning arrangement to partially mask the source/drain regions 604 for implantation and activation. In an embodiment, a "replacement gate", "gate last" or "removing poly gate (RPG)" technique may be used to form the gate. Depending on transistor formation technique, a dummy gate (not shown) such as a polysilicon structure, for example, may be formed over the gate stack 602 as well. In an embodiment, a poly gate layer may be masked and etched in the same step as etching the cap layer 502 to form a dummy gate. Such a dummy gate may be used, for example, in a replacement gate technique to form the sidewall spacers 606 and removed in a subsequent step prior to formation of a permanent metal gate. Additionally, skilled practitioners will recognize that other embodiments may comprise formation of additional device features not shown herein for clarity, such as lightly doped drift-drain regions, silicide regions, contacts, passivation layers, or the like.

Figure 7:
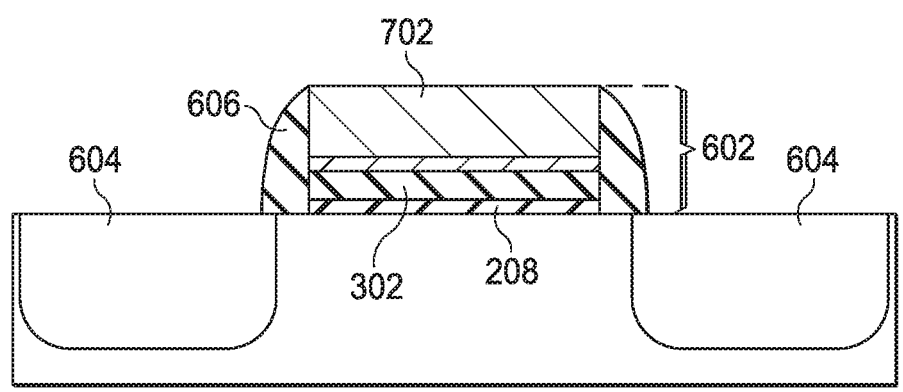

A metal gate 702 may be formed in block 114, as shown in FIG. 7. In one embodiment, the metal gate 702 may be formed over the cap layer 502 using CVD, PVD, ALD, or another suitable deposition process. Additionally, the metal gate 702 may be formed of a suitable conducting material, such as aluminum (Al), tungsten (W), titanium (Ti), copper (Cu), gold (Au), compounds of the same, or the like. For example, the cap layer 502 may be formed of TiN having a first titanium-to-nitrogen ratio, and the metal gate may be TiN having a second, different, titanium-to-nitrogen ratio. Such an embodiment may permit the cap layer 502 to be tuned to adjust the work function of the metal gate 702. Alternatively, in one embodiment, the metal gate may be of a metal or compound different from that of the cap layer 502. For example, the cap layer 502 may be TiN, while the metal gate 702 is copper. Additionally, the metal gate 702 may be a non-metallic, yet conducting compound, such as polysilicon or the like.

Additionally, while the process and method 100 disclosed herein is described with reference to a "replacement gate", "removing poly gate" or "RPG" transistor formation methodology, skilled artisans will recognize that the embodiments presented herein may be employed in other methodologies, including, but not limited to, gate first, silicon on insulator, finFET, multigate, or other structure fabrication techniques. For example, a "gate first" technique may comprise forming a metal gate 702 prior to formation of the sidewall spacers 606 and prior to source/drain region 604 implantation.

In an embodiment, the plasma treatment may be performed in block 122 after the oxygen plasma etch of block 114 but prior to removal of the mask 204 in block 116. Such an embodiment may permit the mask 204 to protect the substrate 202 from plasma damage. Referring to block 124 of FIG. 1, in another embodiment, the plasma treatment may be performed after removing the mask in block 116, and prior to sidewall and source/drain formation, in block 118.

Skilled practitioners will recognize that the plasma treatment parameters may be adjusted to account for the mask 204 or any overlying layers such as the metal gate being present on the high-k layer 302 during the plasma treatment.

Figure 8:
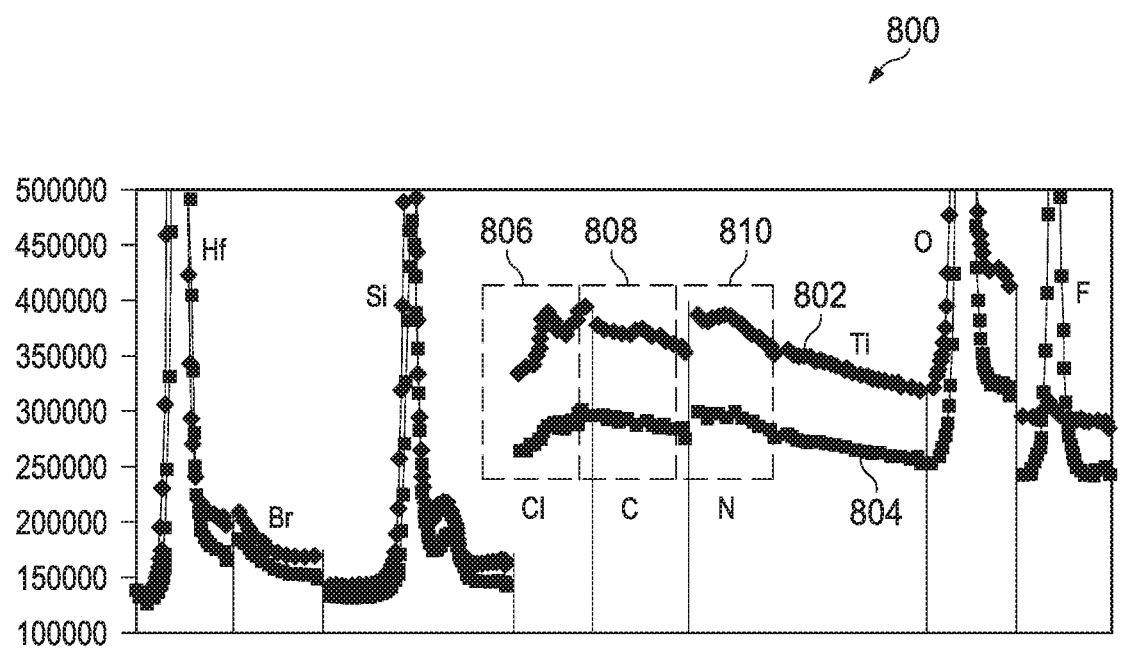
FIG. 8 illustrates an embodiment of a result of treatment of a high-k film according to an embodiment.

FIG. 8 illustrates an embodiment of a chart 800 showing the results of treatment of a high-k film structure according to an embodiment. The chart 800 shows the intensity of an X-ray photoelectron spectroscopy (XPS) test of a high-k film structure. XPS is a quantitative spectroscopic technique that measures the elemental composition, empirical formula, chemical state and electronic state of the elements that exist within a material. XPS spectra are obtained by irradiating a material with a beam of X-rays while simultaneously measuring the kinetic energy and number of electrons that escape from the top 1 to 10 nm of the material being analyzed. The XPS chart 800 is a plot of the number of electrons detected (Y-axis, ordinate) versus the binding energy of the electrons detected (X-axis). Each element produces a characteristic set of XPS peaks at characteristic binding energy values that directly identify each element that exist in or on the surface of the material being analyzed. The number of detected electrons in each of the characteristic peaks is directly related to the amount of element within the area (volume) irradiated.

The first test trace 802 shows the composition of a high-k film structure before plasma treatment according to an embodiment, and the second test trace 804 illustrates the composition of the high-k film structure after plasma treatment. Concentrations of chlorine (Cl) 806, carbon (C) 808, and nitrogen (N) 810 are reduced due to the plasma treatment. Additionally, these impurities are more selectively removed by the plasma treatment than most other materials. For example, the concentrations of hafnium (Hf), bromine (Br), silicon (Si) titanium (Ti), oxygen (O), fluorine (F), carbon compounds ($CO_x/C$—$F/C_xN_y$), titanium compounds ($TiO_x/TiN$), silicon compounds ($Si_3N_4/SiO_2/SiCl_x$), hafnium oxides ($Hf_xO_y$), nitrogen oxides ($NO_x$) and molecules with compound binding energy between about 1 eV and about 1400 eV) are largely the same before and after the plasma treatment. In one embodiment, a portion of the impurities can be removed, and the concentration of one or more selected impurities will be reduced. In another embodiment, the plasma treatment will reduce the concentration of one or more selected impurities by about 25% or more. In one embodiment, the plasma treatment reduces the molecular concentration of one or more the C, Cl and N impurities below 50% in the high-k layer 302.

Thus, one embodiment of a method for forming a device may comprise forming a high-k layer over a substrate and applying a dry plasma treatment to the high-k layer and removing at least a portion of one or more impurity types from the high-k layer. A cap layer may be applied on the high-k layer and a metal gate formed on the cap layer. An interfacial layer may optionally be formed on the substrate, with the high-k layer is formed on the interfacial layer. The high-k layer may have a dielectric constant greater than 3.9, and the cap layer may optionally be titanium nitride.

In one embodiment, the dry plasma treatment is a dry treatment of a material selected from fluorine and oxygen. In another embodiment, the dry plasma treatment is a dry chlorine plasma treatment. The dry chlorine plasma treatment may optionally be applied with about a 50% chlorine concentration. In one embodiment, the plasma treatment may be applied after the high-k layer is applied and before the cap layer is applied. In another embodiment, the plasma treatment may be applied after the cap layer is applied.

Another embodiment of a method for forming a device may comprise forming a mask on a substrate, the mask having an opening defining a gate region, forming an interfacial layer in contact with the substrate in the gate region and forming a high-k layer in contact with the interfacial layer in the gate region. At least a portion of one or more impurities in the high-k layer may be removed by applying a plasma treatment to the high-k layer. The method may further comprise forming a cap layer over the high-k layer in the gate region and forming a metal gate over the cap layer in the gate region. The plasma treatment may be applied after forming the cap layer, and the high-k layer may comprise a hafnium compound. In one embodiment, the plasma treatment may be a dry plasma treatment comprising a material selected from chlorine and fluorine.

In some embodiments, the plasma treatment reduces at least one impurity in the high-k layer by at last about 15%, and one some embodiments, the at least one impurity is one or more of chlorine, carbon and nitrogen.

Another embodiment of a method for forming a device may comprise forming a mask on a substrate, the mask having an opening defining a gate region over a channel region, forming a high-k layer in the gate region and forming a cap layer over the high-k layer in the gate region. At least a portion of one or more impurities in the high-k layer and in the cap layer may be removed by applying a plasma treatment to the high-k layer, which may optionally be hafnium oxide. The cap layer may be a different material than the high-k layer. The dry plasma treatment may be a dry treatment of chlorine at 50% concentration.

A device according to an embodiment may comprise a high-k layer disposed on a substrate and over a channel region in the substrate. The high-k layer may have a molecular concentration of one or more impurities selected from C, Cl and N below about 50%. A cap layer may be formed over the high-k layer over the channel region, with the high-k layer separating the cap layer and the substrate. The high-k layer may be hafnium oxide and the cap layer may be a different material than the high-k layer. Although the present embodiments and their advantages have been described in detail, it should be understood that various changes, substitutions and alterations can be made herein without departing from the spirit and scope of the disclosure as defined by the appended claims. It will be readily understood by those skilled in the art that many of the features and functions discussed above can be implemented using a variety of materials and orders to the processing steps. For example, the high-k layer 302 may be a thermal oxide. The high-k material may also be applied to other structures, including, but not limited to, a capacitor dielectric, over a finFET channel region, as a barrier film, in a through via, or the like. As another example, it will be readily understood by those skilled in the art that many of the steps for treating a high-k film during formation of a thin-film device may be performed in any advantageous order.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, apparatuses, manufacture, compositions of matter, means, methods, or steps.

What is claimed is:

1. A method, comprising:

forming a source region and a drain region in a substrate; and forming a gate stack disposed between the source region and the drain region, the gate stack comprising a high-k dielectric layer disposed over the substrate, a conductive cap layer disposed over the high-k dielectric layer, and a gate electrode disposed over the conductive cap layer, wherein the high-k dielectric layer comprises a plurality of impurities, the impurities comprising at least one of C, Cl, or N, the impurities further comprising F, wherein forming the gate stack comprises exposing the high-k dielectric layer to a plasma treatment, wherein a molecular concentration of the impurities is below about 50%, wherein an atomic concentration of the F in a topmost 1 to 10 nm of the high-k dielectric layer is less than an atomic concentration of the at least one of C, Cl, or N in the topmost 1 to 10 nm of the high-k dielectric layer before exposing the high-k dielectric layer to the plasma treatment, and wherein an atomic concentration of the F in the topmost 1 to 10 nm of the high-k dielectric layer is greater than an atomic concentration of the at least one of C, Cl, or N in the topmost 1 to 10 nm of the high-k dielectric layer after exposing the high-k dielectric layer to the plasma treatment.

2. The method of claim 1, further comprising forming sidewall spacers disposed laterally adjacent to the gate stack.

3. The method of claim 1, wherein forming the gate stack comprises depositing the conductive cap layer over the high-k dielectric layer using at least one of a physical vapor deposition process or an atomic layer deposition process.

4. The method of claim 1, wherein forming the gate stack comprises exposing the conductive cap layer to a plasma oxygen etch process prior to forming the gate electrode over the conductive cap layer.

5. The method of claim 1, wherein the high-k dielectric layer comprises a compound of hafnium.

6. The method of claim 1, wherein the gate stack further comprises an interfacial layer disposed between the high-k dielectric layer and the substrate.

7. The method of claim 6, wherein a thickness of the interfacial layer is in a range from about 5 Angstroms to about 25 Angstroms.

8. A method of forming a device, the method comprising:

depositing a hafnium-containing layer over a channel region of a substrate;

forming a conductive cap layer over the hafnium-containing layer, wherein each of the hafnium-containing layer and the conductive cap layer comprise impurities;

exposing the conductive cap layer to a reactive plasma treatment process, the reactive plasma treatment process reducing a concentration of the impurities in the conductive cap layer and the hafnium-containing layer, wherein exposing the conductive cap layer to the reactive plasma treatment process increases a fluorine concentration in the hafnium-containing layer, wherein a concentration of fluorine in the hafnium-containing layer before exposing the conductive cap layer to the reactive plasma treatment process is less than a concentration of carbon, less than a concentration of chlorine, and less than a concentration of nitrogen in the hafnium-containing layer; and plasma oxygen etching the conductive cap layer, wherein the plasma oxygen etching is performed separately from the reactive plasma treatment process.

9. The method of claim 8, wherein the reactive plasma treatment process comprises a dry plasma treatment using a material comprising one of chlorine, fluorine or oxygen.

10. The method of claim 8, wherein the conductive cap layer and the hafnium-containing layer differ in composition.

11. The method of claim 8, wherein the impurities in the hafnium-containing layer comprise carbon, chlorine, and nitrogen.

12. The method of claim 8, wherein a concentration of fluorine in the hafnium-containing layer after exposing the conductive cap layer to the reactive plasma treatment is greater than a concentration of carbon, greater than a concentration of chlorine, and greater than a concentration of nitrogen in the hafnium-containing layer.

13. The method of claim 8, wherein the plasma oxygen etching is performed after the exposing the conductive cap layer to the reactive plasma treatment process.

14. The method of claim 8, wherein the plasma oxygen etching is performed before the exposing the conductive cap layer to the reactive plasma treatment process.

15. A method comprising:

forming an interfacial layer over a substrate;

depositing a high-k layer over the interfacial layer;

performing a plasma treatment on the high-k layer, wherein a ratio of a concentration of fluorine to a concentration of an impurity comprising at least one of carbon, chlorine, or nitrogen before performing the plasma treatment is less than a ratio of a concentration of fluorine to a concentration of the impurity after performing the plasma treatment;

depositing a cap layer over the high-k layer;

etching the cap layer with an oxygen plasma to adjust the thickness of the cap layer; and forming a metal gate over the cap layer.

16. The method of claim 15, wherein the plasma treatment comprises a fluorine-based plasma treatment.

17. The method of claim 15, wherein the plasma treatment is performed before depositing the cap layer over the high-k layer.

18. The method of claim 15, wherein the plasma treatment is performed after depositing the cap layer over the high-k layer.

19. The method of claim 15, wherein the concentration of fluorine in the high-k layer before performing the plasma treatment is less than the concentration of the impurity in the high-k layer, and wherein the concentration of fluorine in the high-k layer after performing the plasma treatment is greater than the concentration of the impurity in the high-k layer.

20. The method of claim 15, wherein the high-k layer further comprises titanium, wherein a concentration of titanium in the high-k layer before performing the plasma treatment is greater than a concentration of titanium in the high-k layer after performing the plasma treatment.

* * * * *